US008520430B2

(12) United States Patent
Bangsaruntip et al.

(10) Patent No.: US 8,520,430 B2
(45) Date of Patent: Aug. 27, 2013

(54) NANOWIRE CIRCUITS IN MATCHED DEVICES

(75) Inventors: Sarunya Bangsaruntip, Mount Kisco, NY (US); Guy Cohen, Mohegan Lake, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/554,057

(22) Filed: Jul. 20, 2012

(65) Prior Publication Data

US 2012/0280206 A1  Nov. 8, 2012

Related U.S. Application Data

(62) Division of application No. 12/758,939, filed on Apr. 13, 2010, now Pat. No. 8,324,940.

(51) Int. Cl.
*G11C 11/00* (2006.01)
(52) U.S. Cl.
USPC ........... 365/154; 257/903; 365/156; 977/938; 977/943
(58) Field of Classification Search
None
See application file for complete search history.

(56) References Cited

U.S. PATENT DOCUMENTS

| | | | |
|---|---|---|---|
| 4,995,001 A | 2/1991 | Dawson et al. | |
| 5,308,445 A | 5/1994 | Takasu | |
| 5,438,018 A | 8/1995 | Mori et al. | |
| 5,552,622 A | 9/1996 | Kimura | |
| 5,574,308 A | 11/1996 | Mori et al. | |
| 5,668,046 A | 9/1997 | Koh et al. | |
| 6,365,465 B1 | 4/2002 | Chan et al. | |
| 6,642,115 B1 | 11/2003 | Cohen et al. | |
| 6,653,209 B1 | 11/2003 | Yamagata | |

(Continued)

FOREIGN PATENT DOCUMENTS

| | | |
|---|---|---|
| EP | 217811 A1 | 4/2010 |
| KR | 20090044799 A | 5/2009 |
| WO | 02084757 A1 | 10/2002 |
| WO | WO2008069765 A1 | 6/2008 |

OTHER PUBLICATIONS

Transmittal and International Preliminary Report on Patentability for International Application No. PCT/US2011/029304; International Filing Date: Mar. 22, 2011; date of mailing Oct. 26, 2012, 2 pages.

(Continued)

*Primary Examiner* — Alexander Sofocleous
(74) *Attorney, Agent, or Firm* — Cantor Colburn LLP; Vazken Alexanian

(57) ABSTRACT

A memory device includes a first nanowire connected to a first bit line node and a ground node, a first field effect transistor (FET) having a gate disposed on the first nanowire, a second FET having a gate disposed on the first nanowire, a second nanowire connected to a voltage source node and a first input node, a third FET having a gate disposed on the second nanowire, a third nanowire connected to the voltage source node and a second input node, a fourth FET having a gate disposed on the third nanowire, a fourth nanowire connected to a second bit line node and the ground node, a fifth FET having a gate disposed on the fourth nanowire, and a sixth FET having a gate disposed on the fourth nanowire.

20 Claims, 3 Drawing Sheets

(56) References Cited

U.S. PATENT DOCUMENTS

| | | | |
|---|---|---|---|
| 6,806,141 B2 | 10/2004 | Kamins | |
| 6,835,618 B1 | 12/2004 | Dakshina-Murthy et al. | |
| 6,855,606 B2 | 2/2005 | Chen et al. | |
| 6,882,051 B2 | 4/2005 | Majumdar et al. | |
| 6,891,227 B2 | 5/2005 | Appenzeller et al. | |
| 6,903,013 B2 | 6/2005 | Chan et al. | |
| 6,996,147 B2 | 2/2006 | Majumdar et al. | |
| 7,101,762 B2 | 9/2006 | Cohen et al. | |
| 7,151,209 B2 | 12/2006 | Empedocles et al. | |
| 7,180,107 B2 | 2/2007 | Appenzeller et al. | |
| 7,211,853 B2 | 5/2007 | Bachtold et al. | |
| 7,253,060 B2 | 8/2007 | Yun et al. | |
| 7,297,615 B2 | 11/2007 | Cho et al. | |
| 7,311,776 B2 | 12/2007 | Lin et al. | |
| 7,443,025 B2 | 10/2008 | Verbist | |
| 7,446,025 B2 | 11/2008 | Cohen et al. | |
| 7,449,373 B2 | 11/2008 | Doyle et al. | |
| 7,452,759 B2 | 11/2008 | Sandhu | |
| 7,452,778 B2 | 11/2008 | Chen et al. | |
| 7,456,068 B2 | 11/2008 | Kavalieros et al. | |
| 7,456,476 B2 | 11/2008 | Hareland et al. | |
| 7,473,943 B2 | 1/2009 | Mostarshed et al. | |
| 7,498,211 B2 | 3/2009 | Ban et al. | |
| 7,550,333 B2 | 6/2009 | Shah et al. | |
| 7,569,941 B2 | 8/2009 | Majumdar et al. | |
| 7,642,578 B2 | 1/2010 | Lee et al. | |
| 7,791,144 B2 | 9/2010 | Chidambarrao et al. | |
| 7,799,657 B2 | 9/2010 | Dao | |
| 7,803,675 B2 | 9/2010 | Suk et al. | |
| 7,834,345 B2 | 11/2010 | Bhuwalka et al. | |
| 7,871,870 B2 | 1/2011 | Mostarshed et al. | |
| 7,893,506 B2 | 2/2011 | Chau et al. | |
| 8,064,249 B2 * | 11/2011 | Jang et al. | 365/164 |
| 8,097,515 B2 | 1/2012 | Bangsaruntip et al. | |
| 8,154,127 B1 | 4/2012 | Kamins et al. | |
| 8,338,280 B2 | 12/2012 | Tan et al. | |
| 2004/0149978 A1 | 8/2004 | Snider | |
| 2004/0166642 A1 | 8/2004 | Chen et al. | |
| 2005/0121706 A1 | 6/2005 | Chen et al. | |
| 2005/0266645 A1 | 12/2005 | Park | |
| 2005/0275010 A1 | 12/2005 | Chen et al. | |
| 2006/0033145 A1 | 2/2006 | Kakoschke et al. | |
| 2006/0138552 A1 | 6/2006 | Brask et al. | |
| 2006/0197164 A1 | 9/2006 | Lindert et al. | |
| 2007/0001219 A1 | 1/2007 | Radosavljevic et al. | |
| 2007/0267619 A1 | 11/2007 | Nirschl | |
| 2007/0267703 A1 | 11/2007 | Chong et al. | |
| 2007/0284613 A1 | 12/2007 | Chui et al. | |
| 2008/0014689 A1 | 1/2008 | Cleavelin et al. | |
| 2008/0061284 A1 | 3/2008 | Chu et al. | |
| 2008/0067495 A1 | 3/2008 | Verhulst | |
| 2008/0067607 A1 | 3/2008 | Verhulst et al. | |
| 2008/0079041 A1 | 4/2008 | Suk et al. | |
| 2008/0085587 A1 | 4/2008 | Wells et al. | |
| 2008/0121932 A1 | 5/2008 | Ranade | |
| 2008/0128760 A1 | 6/2008 | Jun et al. | |
| 2008/0135949 A1 | 6/2008 | Lo et al. | |
| 2008/0142853 A1 | 6/2008 | Orlowski | |
| 2008/0149914 A1 | 6/2008 | Samuelson et al. | |
| 2008/0149997 A1 | 6/2008 | Jin et al. | |
| 2008/0150025 A1 | 6/2008 | Jain | |
| 2008/0179752 A1 | 7/2008 | Yamauchi et al. | |
| 2008/0191196 A1 | 8/2008 | Lu et al. | |
| 2008/0224224 A1 | 9/2008 | Vandenderghe et al. | |
| 2008/0227259 A1 | 9/2008 | Avouris et al. | |
| 2008/0246021 A1 | 10/2008 | Suk et al. | |
| 2008/0247226 A1 | 10/2008 | Liu et al. | |
| 2008/0290418 A1 | 11/2008 | Kalburge | |
| 2009/0026553 A1 | 1/2009 | Bhuwalka et al. | |
| 2009/0057650 A1 | 3/2009 | Lieber et al. | |
| 2009/0057762 A1 | 3/2009 | Bangsaruntip et al. | |
| 2009/0061568 A1 | 3/2009 | Bangsaruntip et al. | |
| 2009/0090934 A1 | 4/2009 | Tezuka et al. | |
| 2009/0134467 A1 | 5/2009 | Ishida et al. | |
| 2009/0149012 A1 | 6/2009 | Brask et al. | |
| 2009/0181477 A1 | 7/2009 | King et al. | |
| 2009/0217216 A1 | 8/2009 | Lee et al. | |
| 2009/0294864 A1 | 12/2009 | Suk et al. | |
| 2010/0140589 A1 | 6/2010 | Ionescu | |
| 2010/0193770 A1 | 8/2010 | Bangsaruntip et al. | |
| 2010/0207102 A1 | 8/2010 | Lee et al. | |
| 2011/0133169 A1 | 6/2011 | Bangsaruntip et al. | |
| 2011/0147840 A1 | 6/2011 | Cea et al. | |
| 2012/0146000 A1 | 6/2012 | Bangsaruntip et al. | |
| 2013/0001517 A1 | 1/2013 | Bangsaruntip et al. | |

OTHER PUBLICATIONS

Andriotis et al., Realistic nanotube-metal contact configuration for molecular electronics applications, IEEE Sensors Journal, vol. 8, No. 6, Jun. 2008.

Bahar, R. 'Trends and Future Directions in Nano Structure Based Computing and Fabrication', ICCD 2006, International Conf. on Computer Design, Oct. 1-4, 2007, pp. 522-527.

Bjork, M.T., et al., "Silicon Nanowire Tunneling Field-Effect Transistors," Applied Physics Letters 92, 193504, May 13, 2008.

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Checka, N., 'Circuit Architecture for 3D Integration', Chapter 13 in Wafer Level 3-D ICs Process Technology, ed. C.S. Tan, Springer US, 2008, ISBN 978-0-387-76534-1.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Ernst et al., "3D Multichannels and Stacked Nanowires Technologies for New Design Opportunities in Nanoelectronics," IEEE International Conference on Integrated Circuit and Technology and Tutorial, 2008. ICICDT 2008, Jun. 2-4, 2008 pp. 265-268.

Gates, Alexander J. "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

Hu et al., 'Fringing field effects on electrical resistivity of semiconductor nanowire-metal contacts', Applied Physics Letters 92, 083503, Feb. 27, 2008.

Knoch et al., "Tunneling phenomena in carbon nanotube field-effect transistors," Phys Stat Sol. (a) 205, No. 4, 679-694, Mar. 19, 2008.

Lauhon et al., 'Epitaxial core-shell and core-multishell nanowire heterostructures', Nature, vol. 420, Nov. 7, 2002, pp. 57-61.

Leonard et al., 'Size-dependent effects on electrical contacts to nanotubes and nanowires', Phys Rev Lett., Jul. 14, 2006; 97(2):026804.

Ma et al., 'High-performance nanowire complementary metal-semiconductor inverters', Applied Physics Letters 93, 053105, Aug. 6, 2008.

Saumitra Raj mehrotra, A Simulation Study of Silicom Nanowire Field Effect Transistors (FETs), University of Cincinnati, Jul. 2007.

Neudeck, G.W., "An Overview of Double-Gate MOSFETs," Proceedings of 15th Biennial University/Government/Industry Microelectronics Symposium. UGIM 2003. New York, NY: IEEE, US, Jun. 30-Jul. 2, 2003, pp. 214-217.

Office Action—Non-Final for U.S. Appl. No. 12/778,315, filed May 12, 2010; First Named Inventor: Sarunya Bangsaruntip; Mailing Date: Mar. 26, 2012.

Office Action—Non-Final for U.S. Appl. No. 12/776,485, filed May 10, 2010; Fist Named Inventor: Sarunya Bangsaruntip; Mailing Date: Feb. 21, 2012.

Office Action—Restriction Election for U.S. Appl. No. 12/776,485, filed May 10, 2010; First Named Inventor: Sarunya Bangsaruntip; Mailing Date: Dec. 9, 2011.

Restriction/Election Office Action for U.S. Appl. No. 12/758,939, filed Apr. 13, 2010; First Named Inventor: Sarunya Bangsaruntip; Mailing Date: Jun. 8, 2012.

Pavanello et al., "Evaluation of Triple-Gate FinFETS with SiO2—HfO2—TiN Gate Stack Under Analog Operation," Solid State Electronics, Elsevier Science Publishers, Barking, GB, vol. 51, No. 2, Mar. 7, 2007, pp. 285-291.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report; International Application No. PCT/EP2011/053174; International Filing Date: Mar. 3, 2011; Date of Mailing: May 31, 2011.

International Search Report; International Application No. PCT/US2011/029304; International Filing Date: Mar. 22, 2011; Date of Mailing: May 20, 2011.

International Search Report; International Application No. PCT/US11/49501; International Filing Date: Aug. 29, 2011; Date of Mailing: Jan. 18, 2012.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/US2011/029304; International Filing Date: Mar. 22, 2011; Date of Mailing: May 20, 2011.

International Search Report—Written Opinion; International Application No. PCT/EP2010/066961; International Filing Date: Nov. 8, 2010; Date of Mailing: Feb. 10, 2011.

International Search Report Written Opinion; International Application No. PCT/US11/49501; International Filing Date: Aug. 29, 2011; Date of Mailing: Jan. 18, 2012.

International Search Report—Written Opinion; International Application No. PCT/EP2011/053174; International Filing Date: Mar. 3, 2011; Date of Mailing: May 31, 2011.

Singh et al., 'Si, SiGe Nanowire Devices by Top-Down Technology and Their Applications', IEEE Transactions on Electron Devices, vol. 55, No. 11, Nov. 2008, pp. 3107-3118.

Su, Taichi et al., New Planar Self-Aligned Double-Gate Fully Depleted P-MOSFET's Using Epitaxial Lateral Overgrowth (ELO) and Selectively Grown Source/Drain (S/D), 2000 IEEE International SOI Conference, Oct. 2000, pp. 110-111.

Xiang, Jie et al., "Ge/Si Nanowire Heterostructures as High-Performance Field-Effect Transistors," Nature 441, 489-493 (May 25, 2006).

Ziegler et al., "The CMOS/NANO Interface from a Circuits Perspective," ISCAS '03. Proceedings of the 2003 International Symposium on Circuits and Systems, May 25-28, 2003, vol. 4, pp. IV-904-IV-907.

Chen et al., "An Integrated Logic Circuit Assembled ona Single Carbon Nanotube", www.sciencemag.org Science, vol. 311, Mar. 24, 2006, p. 1735.

Derycke, et al, "Carbon Nanotube Inter- and Intramolecular Logic Gates" Nano Letters, Sep. 2001, vol. 1, No. 9, pp. 453-456.

Office Action—Non-Final for U.S. Appl. No. 12/684,280, filed Jan. 8, 2010; First Named Inventor: Sarunya Bangsaruntip; Mailing Date: May 2, 2011.

Office Action—Non-Final for U.S. Appl. No. 12/856,718, filed Aug. 16, 2010; first Named Inventor Sarunya Bangsaruntip; Mailing Date: Jul. 9, 2012.

Office Action—Non-Final for U.S. Appl. No. 13/372,719, filed Feb. 14, 2012; First Named Inventor: Sarunya Bangsaruntip; Mailing Date: May 7, 2012.

Office Action—Restriction Election for U.S. Appl. No. 12/684,280, filed Jan. 8, 2010; First Named Inventor: Sarunya Bangsaruntip; Mailing Date: Feb. 10, 2011.

Office Action—Restriction/Election for U.S. Appl. No. 12/758,939, filed Apr. 13, 2010; First Named Inventor: Sarunya Bangsaruntip; Mailing Date: Jun. 8, 2012.

Office Action—Final for U.S. Appl. No. 12/684,280, filed Jan. 8, 2010; First Named Inventor: Sarunya Bangsaruntip; Mailing Date: Oct. 5, 2011.

Notice of Allowance for U.S. Appl. No. 12/776,485, filed May 10, 2010; First Named Inventor: Sarunya Bangsaruntip; Mailing Date: Sep. 26, 2012.

Office Action—Final for U.S. Appl. No. 13/372,719, filed Feb. 14, 2012; First Named Inventor: Sarunya Bangsaruntip; Mailing Date: Sep. 4, 2012.

Office Action—Non-Final for U.S. Appl. No. 12/631,199, filed Dec. 4, 2009; First Named Inventor: Sarunya Bangsaruntip; Mailing Date: Jun. 13, 2012.

Office Action—Non-Final for U.S. Appl. No. 12/856,718, filed Aug. 16, 2010; First Named Inventor: Sarunya Bangsaruntip; Mailing Date: Jul. 9, 2012.

Office Action—Restriction-Election for U.S. Appl. No. 12/856,718, filed Aug. 16, 2010; First Named Inventor: Sarunya Bangsaruntip; Mailing Date: Apr. 9, 2012.

* cited by examiner

NANOWIRE CIRCUITS IN MATCHED DEVICES

CROSS-REFERENCE TO RELATED APPLICATIONS

This is a divisional application of application Ser. No. 12/758,939, filed Apr. 13, 2010, which is incorporated by reference herein.

FIELD OF INVENTION

The present invention relates to semiconductor nanowire field effect transistors.

DESCRIPTION OF RELATED ART

A nanowire field effect transistor (FET) includes doped portions of nanowire that contact the channel region and serve as source and drain regions of the device. FETs may be fabricated using complimentary metal-oxide-semiconductor methods to form a variety of integrated circuits.

BRIEF SUMMARY

According to one embodiment of the present invention, an inverter device includes a first nanowire connected to a voltage source node and a ground node, a first p-type field effect transistor (pFET) device having a gate disposed on the first nanowire, and a first n-type field effect transistor (nFET) device having a gate disposed on the first nanowire.

According to an alternate embodiment of the present invention a method for forming an inverter device includes forming a first nanowire, forming a first p-type field effect transistor (pFET) device having a gate disposed on the first nanowire, forming a first n-type field effect transistor (nFET) device having a gate disposed on the first nanowire, and electrically connecting the gate of the first pFET device to the gate of the first nFET device.

According to another alternate embodiment of the present invention, a memory device includes a first nanowire connected to a first bit line node and a ground node, a first field effect transistor (FET) having a gate disposed on the first nanowire, a second FET having a gate disposed on the first nanowire, a second nanowire connected to a voltage source node and a first input node, a third FET having a gate disposed on the second nanowire, a third nanowire connected to the voltage source node and a second input node, a fourth FET having a gate disposed on the third nanowire, a fourth nanowire connected to a second bit line node and the ground node, a fifth FET having a gate disposed on the fourth nanowire, and a sixth FET having a gate disposed on the fourth nanowire.

According to yet another alternate embodiment of the present invention, a method for forming a memory device includes forming a first nanowire connected to a first bit line node and a ground node, forming a first field effect transistor (FET) having a gate disposed on the first nanowire, forming a second FET having a gate disposed on the first nanowire, forming a second nanowire connected to a voltage source node and a first storage node, forming a third FET having a gate disposed on the second nanowire, forming a third nanowire connected to the voltage source node and a second storage node, forming a fourth FET having a gate disposed on the third nanowire, forming a fourth nanowire connected to a second bit line node and the ground node, forming a fifth FET having a gate disposed on the fourth nanowire, and forming a sixth FET having a gate disposed on the fourth nanowire.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An integrated circuit may include a number of different types of field effect transistor (FET) devices that may be formed from nanowire channel FET. A nanowire channel FET includes a silicon nanowire that connect to a source region and a drain region and a gate that fully (or partially) surrounds the nanowires. The channel forms at the surface of the nanowires under the gate (or in the bulk of the nanowires for nanowires with diameter smaller than about 5 nm). When the gate fully surrounds the nanowire, the device is referred to as a gate-all-around (GAA) FET. When the gate partially surrounds the nanowires, as in the case when the nanowire is attached to an insulator, the device is referred to as an omega-gate FET. Nanowire FETs may be fabricated to form, for example, nFET and pFET devices. The nFET and pFET devices may be connected to form a variety of integrated circuit devices such as, for example inverters and static random access memory (SRAM). It is generally desirable in circuit devices for FETs to be matched by having, for example, similar threshold voltages and drive current.

Nanowire FET devices that are formed on a wafer may include any number of nanowires. The fabrication process may include, for example, forming a silicon nanowire on a buried oxide (BOX) substrate using an isotropic etching process. The etching process results in an elliptically (including cylindrically) shaped nanowire that may be suspended above the substrate or may be partially disposed on the substrate. A metallic or polysilicon gate structure is formed on the nanowire. Source and drain regions are formed adjacent to the gate structure, and contacts may be formed to connect the source, drain, and gate structure to other devices.

The fabrication process may result in particular nanowires having different properties such as, for example, the diameter of one nanowire on a wafer may be different from the diameter of another nanowire due to the location of the particular nanowire on the wafer. Though the diameters of two different nanowires may vary on a wafer, the diameter of each particular nanowire typically remains constant, and within a desired tolerance.

Integrated circuit devices such as, for example, SRAM and inverters include a number of pFET and nFET devices disposed on nanowires that are arranged on a wafer. Since the properties of the nanowires (e.g., nanowire diameters) effect the operation of the devices, it is desirable to arrange the devices such that effects of the differences in the nanowire properties are reduced.

Figure 1:
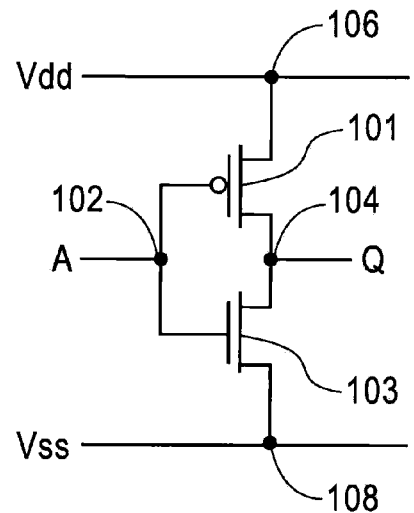
FIG. 1 illustrates a diagram of a prior art example of an inverter circuit.

FIG. 1 illustrates a diagram of a prior art example of an inverter including a pFET device 101 connected to an nFET device 103. The device 101 is connected to a source voltage node (Vdd) 106, an input node (A) 102, and an output node (Q) 104. The device 102 is connected to a ground node (Vss) 108, A, and Q.

Figure 2:
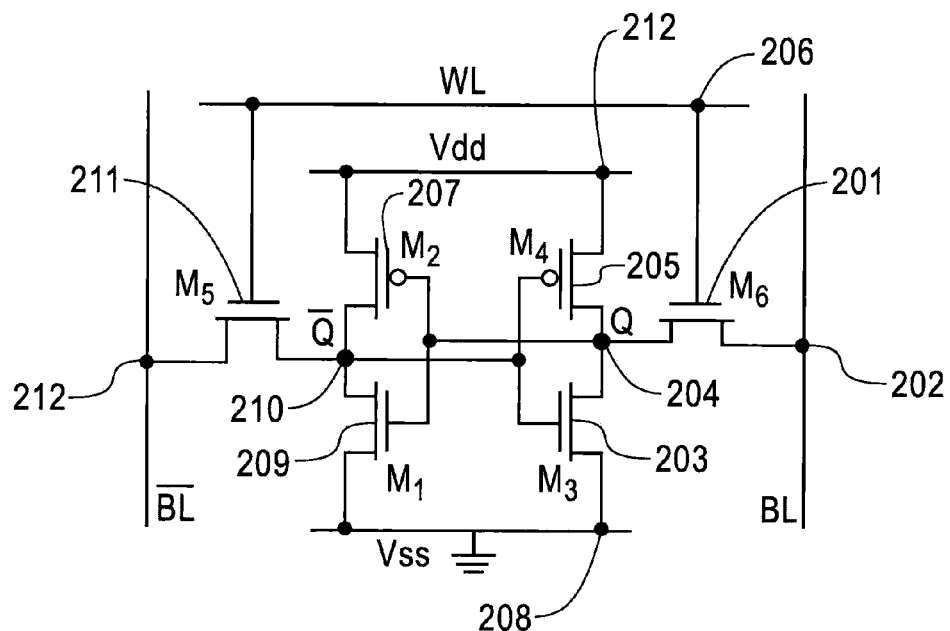
FIG. 2 illustrates a diagram of a prior art example of a static random access memory (SRAM) circuit.

FIG. 2 illustrates a diagram of a prior art example of a static random access memory (SRAM) circuit. The SRAM includes a first nFET device ($M_6$) 201 connected to a first bit line node (BL) 202, a first output node (Q) 204, and a word line node (WL) 206. A second nFET device ($M_3$) 203 is connected to the Q node 204, a ground node (Vss) 208, and a second output node ($\overline{Q}$) 210. A first pFET device ($M_4$) 205 is connected to the Q node 204, the $\overline{Q}$ node 210, and a voltage source node (Vdd) 212. A second pFET device ($M_2$) 207 is connected to the Vdd node 212, the Q node 204, and the $\overline{Q}$ node 210. A third nFET device (M1) 209 is connected to the Vss node 208, the Q node 204, and the $\overline{Q}$ node 210. A fourth nFET device (M5) 211 is connected to a second bit line node ($\overline{BL}$) 212, the WL node 206, and the $\overline{Q}$ node 210.

As discussed above, the nanowires on a wafer may have different diameters that affect the performance characteristics of the gates disposed on the nanowires. The performance of integrated circuits including, for example, the prior art examples of FIGS. 1 and 2 may be improved when particular FETs in the devices have similar characteristics. Thus, designing integrated circuits such that particular FETs share a common nanowire may improve the performance of the circuits through the use of better matched devices in the common wire.

Figure 3:
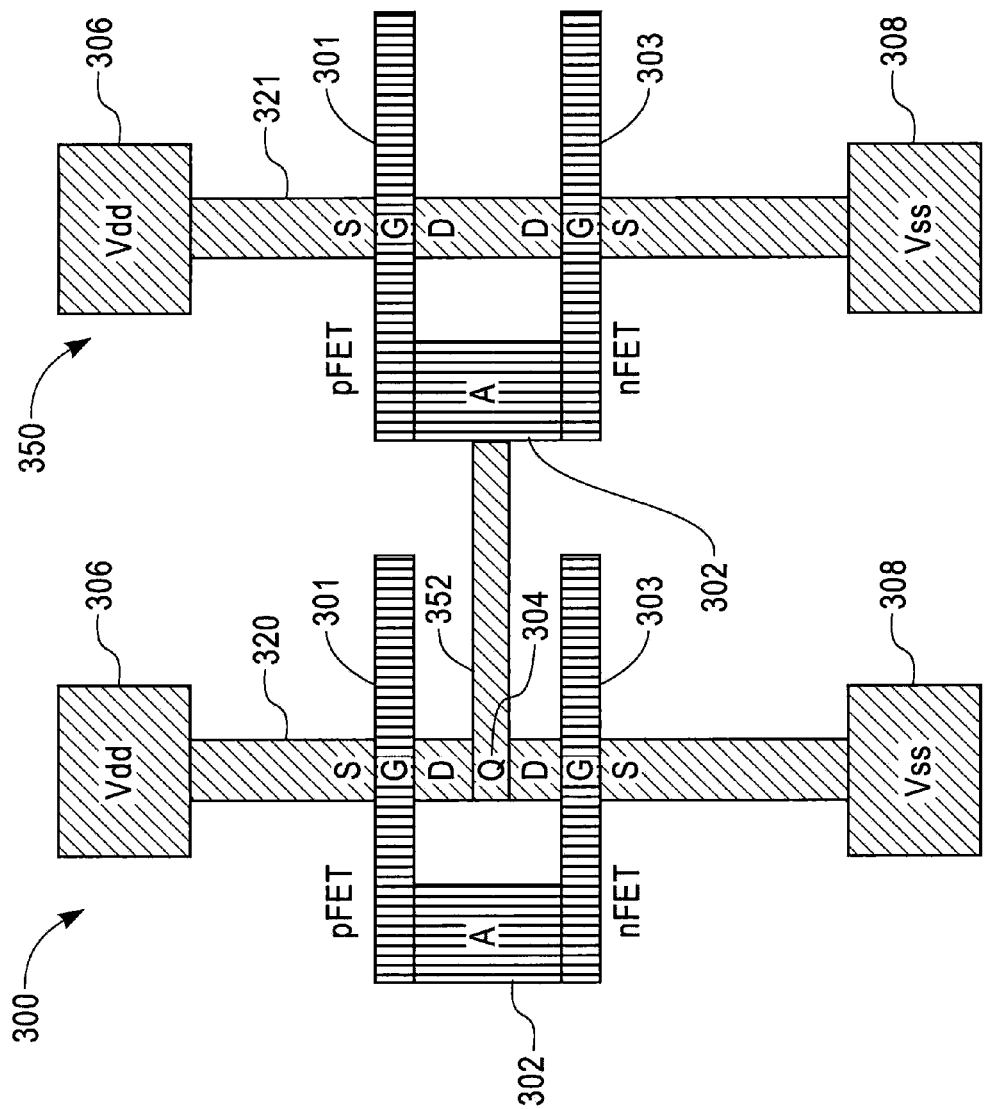
FIG. 3 illustrates and exemplary embodiment of a nanowire inverting circuit.

FIG. 3 illustrates and exemplary embodiment of a nanowire inverting circuit 300 that is fabricated with silicon nanowire devices formed on a substrate as described above. The circuit 300 includes a first nanowire 320 connected to a source voltage node (Vdd) 306 and a ground node (Vss) 308. A pFET device 301 and nFET device 303 have gate regions (G) disposed on the first nanowire 320. The drain regions (D) of the devices 301 and 303 are connected to an output node (Q) 304. The source region (S) of the device 301 is connected to the Vdd 306 node, and the source region (S) of the device 303 is connected to the Vss node 308. The gates of the devices 301 and 303 are connected to an input node (A) 302. The illustrated embodiment includes a second inverting circuit 350 that is similar to the inverting circuit 300. The inverting circuit 350 is formed on a second nanowire 321. The A node 302 of the second inverting circuit 350 is connected to the Q node 304 with a silicon member 352. The arrangement of the inverting circuit 300 on the first nanowire 320 improves the performance of the circuit 300 by disposing the FET devices 301 and 303 on the same nanowire resulting in the FET devices 301 and 303 having similar performance characteristics. Similar advantages are gained by the arrangement of the second inverting circuit 350.

Figure 4:
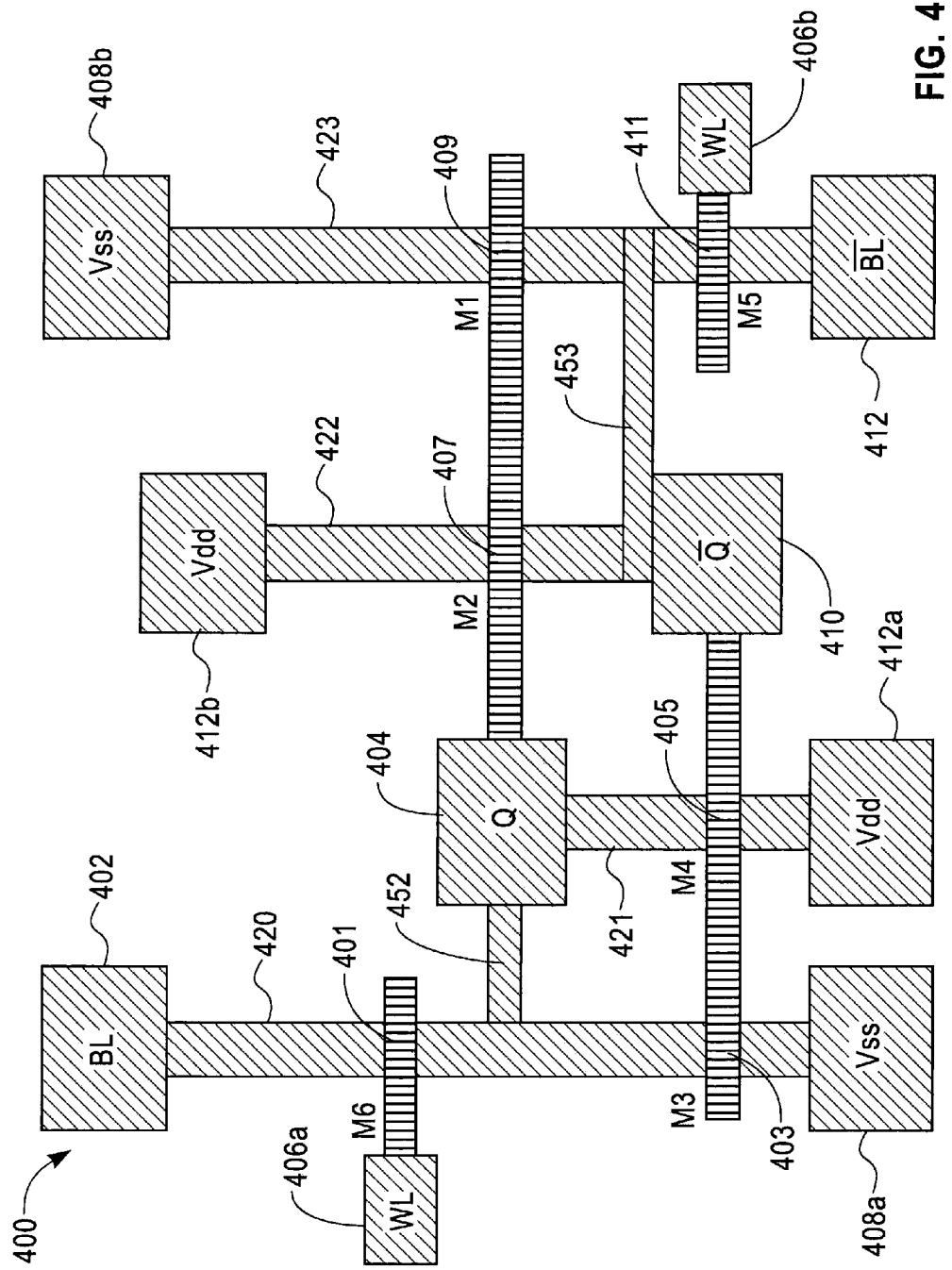
FIG. 4 illustrates an exemplary embodiment of a nanowire SRAM circuit.

FIG. 4 illustrates an exemplary embodiment of a nanowire SRAM circuit 400 that is fabricated with silicon nanowire devices in a similar manner as described above. The circuit 400 includes a first nanowire 420 connected to a bit line node (BL) 402 and a first ground node (Vss) 408a. A first nFET device ($M_6$) 401 is formed on the first nanowire 420 and is connected to the BL node 402, a first output node (Q) 404, and a first word line node (WL) 406a. A second nFET device ($M_3$) 403 is formed on the first nanowire 420 and connected to the Q node 404, the first Vss 408a, and a second output node ($\overline{Q}$) 410. A second nanowire 421 is connected to the Q node 404 and a first voltage source node (Vdd) 412a. A first pFET device ($M_4$) 405 is formed on the second nanowire 421 and connected to the Q node 404, the $\overline{Q}$ node 410, and the Vdd node 212. A third nanowire 422 is connected to a second Vdd node 412b and the $\overline{Q}$ node 410. A second pFET device ($M_2$) 407 is formed on the third nanowire 422 and connected to the Vdd node 412b, the Q node 404, and the $\overline{Q}$ node 410. A fourth nanowire 423 is connected to a second Vss node 408b and bit line node ($\overline{BL}$) 412. A third nFET device (M1) 409 is connected to the second Vss node 208b, the Q node 404, and the $\overline{Q}$ node 410. A fourth nFET device (M5) 411 is connected to the bit line node (BL) 412, a second WL node 406b, and the $\overline{Q}$ node 410. A silicon member 452 may be formed to connect the first nanowire 420 to the Q node 404, and a silicon member 453 may be formed to connect the fourth nanowire 423 to the $\overline{Q}$ node 410.

Though the illustrated embodiments include two examples of the implementation of matching FETs in integrated circuits. The methods described above may be applied to any type of integrated circuit to improve circuit performance by arranging particular FET devices on a particular nanowire such that the FET devices on the same nanowire have similar performance characteristics.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A memory device comprising:
   a first nanowire connected to a first bit line node and a ground node;
   a first field effect transistor (FET) having a gate disposed on the first nanowire;
   a second FET having a gate disposed on the first nanowire;
   a second nanowire connected to a voltage source node and a first input node;
   a third FET having a gate disposed on the second nanowire,
   a third nanowire connected to the voltage source node and a second input node;
   a fourth FET having a gate disposed on the third nanowire;
   a fourth nanowire connected to a second bit line node and the ground node;
   a fifth FET having a gate disposed on the fourth nanowire; and
   a sixth FET having a gate disposed on the fourth nanowire.

2. The device of claim 1, wherein a gate terminal of the first FET is connected to a word line node, a gate terminal of the second FET is connected to the second input node, a gate terminal of the third FET is connected to the second input node, a gate terminal of the fourth FET is connected to the first input node, a gate terminal of the fifth FET is connected to the first input node, and a gate terminal of the sixth FET is connected to the word line node.

3. The device of claim 1, wherein the first FET is a n-type FET device (nFET), the second FET is a nFET, the third FET is a p-type FET device (pFET), the fourth FET is a pFET, the fifth FET is a nFET, and the sixth FET is a nFET.

4. The device of claim 1, wherein the first nanowire is a silicon nanowire.

5. The device of claim 1, wherein the first nanowire is suspended above a substrate.

6. The device of claim 1, wherein a portion of the first nanowire is connected to the first input node, and a portion of the fourth nanowire is connected to the second input node.

7. A method for forming a memory device, the method including:
   forming a first nanowire connected to a first bit line node and a ground node;
   forming a first field effect transistor (FET) having a gate disposed on the first nanowire;
   forming a second FET having a gate disposed on the first nanowire;
   forming a second nanowire connected to a voltage source node and a first input node;
   forming a third FET having a gate disposed on the second nanowire, forming a third nanowire connected to the voltage source node and a second input node;
   forming a fourth FET having a gate disposed on the third nanowire;
   forming a fourth nanowire connected to a second bit line node and the ground node;
   forming a fifth FET having a gate disposed on the fourth nanowire; and
   forming a sixth FET having a gate disposed on the fourth nanowire.

8. The method of claim 7, wherein the first nanowire is a silicon nanowire formed with an isotropic etching process.

9. The method of claim 7, wherein the first nanowire is suspended above a substrate.

10. The method of claim 7, wherein the first nanowire includes a silicon material.

11. The method of claim 7, wherein the second nanowire includes a silicon material.

12. The method of claim 7, wherein the third nanowire includes a silicon material.

13. The method of claim 7, wherein the fourth nanowire includes a silicon material.

14. A method for forming a memory device, the method including:
   forming a first nanowire connected to a first bit line node and a ground node;
   forming a first field effect transistor (FET) having a gate disposed on the first nanowire;
   forming a second FET having a gate disposed on the first nanowire;
   forming a second nanowire connected to a voltage source node and a first storage node;
   forming a third FET having a gate disposed on the second nanowire,
   forming a third nanowire connected to the voltage source node and a second storage node.

15. The method of claim 14, further comprising:
   forming a fourth FET having a gate disposed on the third nanowire;
   forming a fourth nanowire connected to a second bit line node and the ground node;
   forming a fifth FET having a gate disposed on the fourth nanowire; and
   forming a sixth FET having a gate disposed on the fourth nanowire.

16. The method of claim 14, wherein the first nanowire is a silicon nanowire formed with an isotropic etching process.

17. The method of claim 14, wherein the first nanowire is suspended above a substrate.

18. The method of claim 14, wherein the first nanowire includes a silicon material.

19. The method of claim 14, wherein the second nanowire includes a silicon material.

20. The method of claim 14, wherein the third nanowire includes a silicon material.

* * * * *